United States Patent [19]

Shino

[11] Patent Number: 4,993,957
[45] Date of Patent: Feb. 19, 1991

[54] CONTACT PIN

[75] Inventor: Katsuhide Shino, Kyoto, Japan

[73] Assignee: Sharp Kabushiki Kaisha, Osaka, Japan

[21] Appl. No.: 394,744

[22] Filed: Aug. 16, 1989

[30] Foreign Application Priority Data

Aug. 17, 1988 [JP]  Japan .................................. 63-204177

[51] Int. Cl.⁵ .............................................. G01R 31/02
[52] U.S. Cl. .................................. 439/86; 324/158 P; 439/482
[58] Field of Search ................ 439/86, 482; 324/72.5, 324/158 F, 158 P

[56] References Cited

U.S. PATENT DOCUMENTS

| | | | |
|---|---|---|---|
| 2,075,570 | 3/1937 | Carpenter | 29/517 |
| 3,725,844 | 4/1973 | McKeown et al. | 439/930 |
| 3,753,103 | 8/1973 | Tetreault et al. | 324/72.5 |
| 3,870,978 | 3/1975 | Dreyer | 439/289 |
| 4,004,843 | 1/1977 | Boenning et al. | 439/86 |
| 4,927,368 | 5/1990 | Shino | 439/66 |

OTHER PUBLICATIONS

IBM Bulletin, Ward, vol. 18, No. 9, p. 2817, 2–1976.
IBM Bulletin, Humenik, vol. 22, No. 6, p. 2286, 11–1979.

Primary Examiner—Neil Abrams
Attorney, Agent, or Firm—Irell & Manella

[57] ABSTRACT

A contact pin comprising an end tip which is to be brought into contact with a terminal disposed of an IC card, for the transmission of an electric signal through the terminal, the end tip consists of an elastic body which is electrically conductive so that the terminal is prevented from being damaged while assuring the electrical contact between the end tip and the terminal.

5 Claims, 3 Drawing Sheets 4,993,957

CONTACT PIN

BACKGROUND OF THE INVENTION

1. Field of the invention:

This invention relates to an improved contact pin which, for example, is disposed in an apparatus for an IC card to be brought into contact with a terminal formed on a circuit pattern on an inserted IC card.

2. Description of the prior art:

An apparatus into which an IC card is inserted has a plurality of contact pins therein which are brought into contact with terminals formed on a circuit pattern on the inserted IC card so that an electric signal is transmitted between the IC card and the apparatus.

FIG. 5 shows an apparatus having conventional contact pins in which an IC card is used, illustrating how the IC card and the conventional contact pins are brought into contact with each other.

In an IC card 10 which is to be used in an apparatus 12, a circuit pattern is formed, and a plurality of terminals 11 are exposed on the upper surface of the IC card 10. The apparatus 12 has a recess 13 into which the IC card 10 is to be inserted. Above the recess 13, a base 16 which can move vertically is disposed, and a plurality of contact pins 14 are attached to the bottom face of the base 16. Each of the contact pins 14 are elastically pushed down by a coil spring 15.

When the IC card 10 is used, the IC card 10 is inserted into the recess 13 of the apparatus 12 in the direction of arrow A. The base 16 then moves down in the direction of arrow B, and end tips 14a of the contact pins 14 come into contact with the surfaces of the terminals 11 formed on the inserted IC card 10, as shown in FIG. 5.

In the above-mentioned structure, the contact pins 14 are made of metal, and the end tips 14a of the contact pins 14 are sharpened so as to assure the excellent contact between the end tips 14a and the surfaces of the terminals 11. Therefore, as the number of insertions of the IC card 10 into the apparatus 12 increases, and accordingly the number of contacts between the contact pins 14 and the terminals 11 increases, the surface of each terminal 11 is gradually damaged in the region 11a, at which the end tip 14a of the contact pin 14 comes into contact with the terminal 11, thereby forming a concavity in the region 11a, resulting in that an IC card having such a damaged terminal becomes useless.

SUMMARY OF THE INVENTION

The contact pin of this invention, which overcomes the above-discussed and numerous other disadvantages and deficiencies of the prior art, comprises an end tip which is to be brought into contact with a terminal disposed in a circuit, for the transmission of an electric signal through said terminal, said end tip consists of an elastic body which is electrically conductive.

In a preferred embodiment, the elastic body is made of a conductive resin material.

In a preferred embodiment, the elastic body is made of a resin material, and the surface of said elastic body is coated with a conductive material.

In a preferred embodiment, the elastic body is attached to the main body of said contact pin by a conductive adhesive agent.

In a preferred embodiment, the elastic body has a cylindrical shape.

In a preferred embodiment, the elastic body has a spherical shape.

In a preferred embodiment, the elastic body is attached to the main body of said contact pin by projections which are forcedly inserted into said elastic body, said projections being formed at an end portion of said main body.

Thus, the invention described herein makes possible the objectives of (1) providing a contact pin which does not damage a terminal of a circuit; and (2) providing a contact pin which can make an excellent contact between the pin and a terminal of a circuit, without causing the contact pin to damage the terminal.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
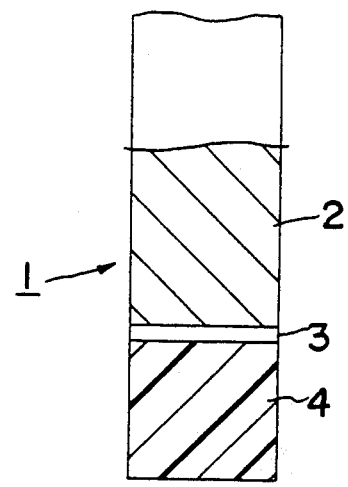
FIG. 1 is a sectional view of a contact pin of this invention.
Figure 5:
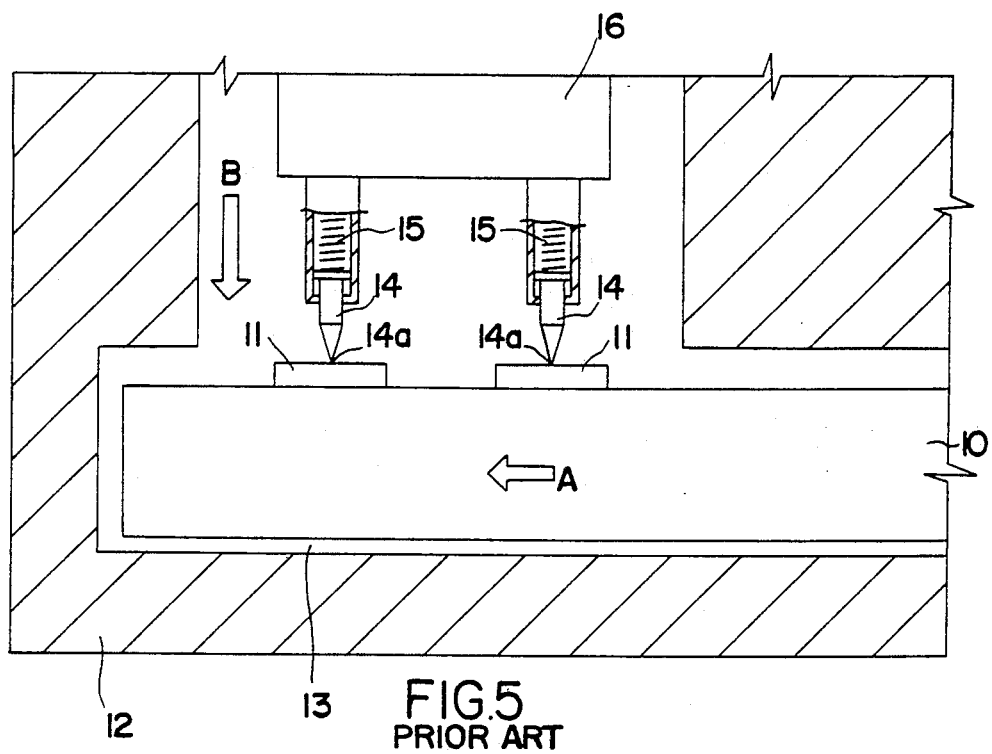
FIG. 5 is a view illustrating how conventional contact pins are brought into contact with terminals on a circuit pattern on an IC card.
Figure 6:
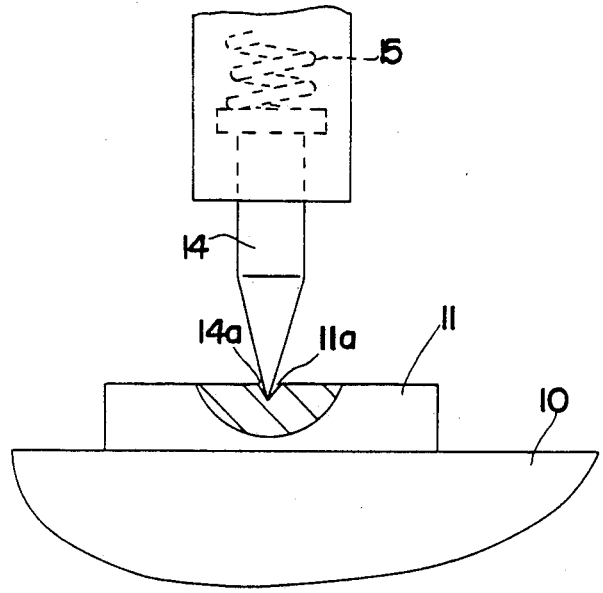
FIG. 6 is an enlarged view of one of the conventional contact pins shown in FIG. 5.

An example of the contact pin according to the invention is illustrated in FIG. 1. A contact pin 1 comprises a main body 2 made of a metal and an end tip 4 which have a cylindrical shape. The end tip 4 is made of a conductive resin elastic material such as silicone rubber containing silver powder, and attached to the bottom face of the main body 2 by a conductive adhesive 3. An example of the conductive adhesive 3 is an adhesive which contains silver powder. The contact pin 1 may be attached to a base (not shown) of an apparatus for an IC card which has the same construction as that shown in FIG. 5. As a conductive elastic material useful in the invention, a wide variety of resin materials known in the art can be used.

Figure 2:
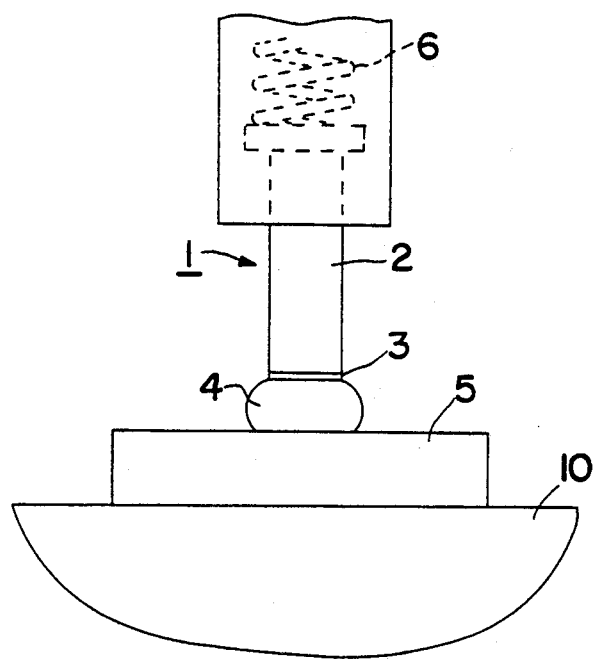
FIG. 2 is a view illustrating how the contact pin of FIG. 1 functions.

FIG. 2 shows how the contact pin 1 shown in FIG. 1 functions. When the contact pin 1 is brought into contact with a terminal 5 of an IC card 10, the contact pin 1 is pressed against the terminal 5 by a force from a coil spring 6 elastically pushing down the contact pin 1, so that the end tip 4 is deformed to be flat and comes into face-contact with the terminal 5 in a wide area thereof, resulting in an excellent contact between the contact pin 1 and the terminal 5. Furthermore, the end tip 4 made of silicone rubber is not so hard, and force from the contact pin does not concentrate on any particular point of the terminal 5, thereby preventing the terminal 5 from being damaged.

Figure 3:
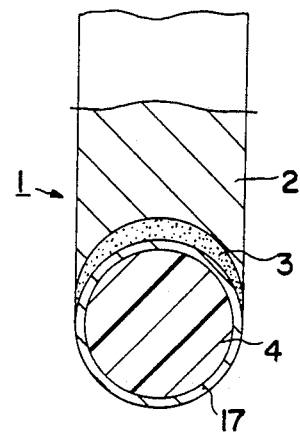
FIG. 3 is a sectional view of another contact pin of this invention.

FIG. 3 shows another contact pin according to the invention. In the contact pin 1 of FIG. 3, the end tip 4 is made of silicone rubber having a spherical shape. The surface of the end tip 4 is plated with silver coating 17. The end tip 4 in the form of a bead rests in a recess formed in the end surface of the main body 2 made of a metal, and is attached to the main body 2 by the conductive adhesive 3.

Figure 4:
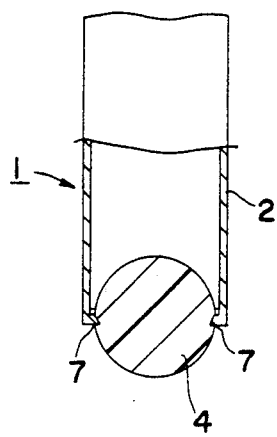
FIG. 4 is a sectional view of still another contact pin of this invention.

FIG. 4 shows still another example of the contact pin according to the invention. In this embodiment, the main body 2 is in the form of a metal pipe having a plurality of projections 7 at the end portion thereof which protrude toward the inside of the main body 2. The end tip 4 in this embodiment is constructed in the same manner as that in the embodiment of FIG. 3. The end tip 4 is pressed into an opening of the end portion of the main body 2, so that the projections 7 of the main body 2 are forcedly inserted into the end tip 4, thereby holding the end tip 4 at the end portion of the main body 2.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a probe-type contact pin comprising an end tip which is to be brought into contact with a terminal disposed on a circuit card, for the transmission of an electric signal through said terminal,
    said, end tip consists of an elastic body which has a spherical shape and is electrically conductive.

2. A contact pin according to claim 1 wherein said elastic body is made of a conductive resin material.

3. A contact pin according to claim 1 wherein said elastic body is made of a resin material, and the surface of said elastic body is coated with a conductive material.

4. A contact pin according to claim 1 wherein said elastic body is attached to the main body of said contact pin by a conductive adhesive agent.

5. A contact pin according to claim 1 wherein said elastic body is attached to the main body of said contact pin by projections which are forcedly inserted into said elastic body, said projections being formed at an end portion of said main body.

* * * * *